(12) United States Patent
Hardt et al.

(10) Patent No.: US 7,554,815 B2
(45) Date of Patent: Jun. 30, 2009

(54) RESILIENT CLIP FOR CIRCUIT BOARD

(75) Inventors: Thomas T. Hardt, Houston, TX (US);
Carlos Torres, Houston, TX (US);
David E. Thomas, Houston, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 55 days.

(21) Appl. No.: 11/445,074

(22) Filed: May 31, 2006

(65) Prior Publication Data

US 2007/0279884 A1 Dec. 6, 2007

(51) Int. Cl.
*H05K 5/00* (2006.01)

(52) U.S. Cl. .................... 361/753; 361/742; 361/758; 361/804; 361/807; 361/810

(58) Field of Classification Search .......... 361/753, 361/742, 758, 804, 807, 810; 174/255, 260; 385/53

See application file for complete search history.

(56) References Cited

U.S. PATENT DOCUMENTS

| 191,870 | A | * | 6/1877 | Lyall ...................... 131/306 |
|---|---|---|---|---|
| 3,271,059 | A | * | 9/1966 | Pearson .................. 411/509 |
| 6,470,556 | B2 | * | 10/2002 | Boe ......................... 29/450 |
| 6,544,047 | B2 | * | 4/2003 | Moore ..................... 439/95 |
| 6,655,976 | B1 | * | 12/2003 | Shipe et al. ............. 439/328 |
| 6,662,411 | B2 | * | 12/2003 | Rubenstein et al. ...... 24/453 |
| 6,751,102 | B1 | | 6/2004 | Chen |
| 6,756,254 | B2 | | 6/2004 | Tews |
| 6,771,512 | B2 | * | 8/2004 | Paquin et al. ............ 361/752 |
| 6,860,641 | B1 | * | 3/2005 | Goldenburg et al. ...... 385/53 |
| 2005/0191870 | A1 | * | 9/2005 | Holt et al. ................. 439/66 |

* cited by examiner

*Primary Examiner*—Jeremy C Norris
*Assistant Examiner*—Andargie M Aychillhum

(57) ABSTRACT

An device including a fastener. In some embodiments, the device is an electronic device that includes a circuit board, a support structure, and a resilient conductive clip. The circuit board may include a slot extending between opposite faces. The resilient conductive clip may couple to the support structure and be removably inserted through the slot so that it is disposed at least partially about the opposite faces. The resilient conductive clip may include lower and upper grounding portions engaged against the opposite faces of the circuit board.

19 Claims, 5 Drawing Sheets

RESILIENT CLIP FOR CIRCUIT BOARD

BACKGROUND

This section is intended to introduce the reader to various aspects of art, which may be related to various aspects of the present invention that are described or claimed below. This discussion is believed to be helpful in providing the reader with background information to facilitate a better understanding of the various aspects of the present invention. Accordingly, it should be understood that these statements are to be read in this light, and not as admissions of prior art.

Computer systems often include a circuit board, a chassis, and electronic components. The circuit board is generally a motherboard, a system board, or a main board, and the electronic components often include a power supply, a sound card, a video card, a backplane, or the like. Typically, the electronic components connect to the circuit board, and the chassis supports the circuit board.

Unfortunately, if the circuit board is not adequately secured to the chassis, the circuit board and electronic components may move and/or disconnect from one another. Additionally, if the circuit board is not adequately secured to the chassis, it may be difficult to reliably connect the circuit board to the electronic components. An unsecured circuit board may shift out of alignment with the electronic components and potentially render a connection between the two unreliable.

DETAILED DESCRIPTION OF SPECIFIC EMBODIMENTS

One or more exemplary embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

The following discussion describes a fastener that, in certain embodiments, resiliently secures a circuit board to a chassis and grounds both sides of the circuit board. Advantageously, such a fastener may potentially reduce the number of connections to the circuit board by grounding both sides of the circuit board. Additionally, some of the following exemplary fasteners couple to the circuit board without the use of tools, thereby, in some embodiments, reducing the risk of a tool damaging the circuit board during installation. Finally, some of the subsequently discussed embodiments accommodate a variety of circuit boards with different thicknesses. Advantageously, some of these embodiments may lower computer system manufacturing costs by reducing the number of parts that are kept in stock to build a variety of computer systems, as a single type of fastener may couple to a variety of different types of circuit boards.

Figures 1, 2:
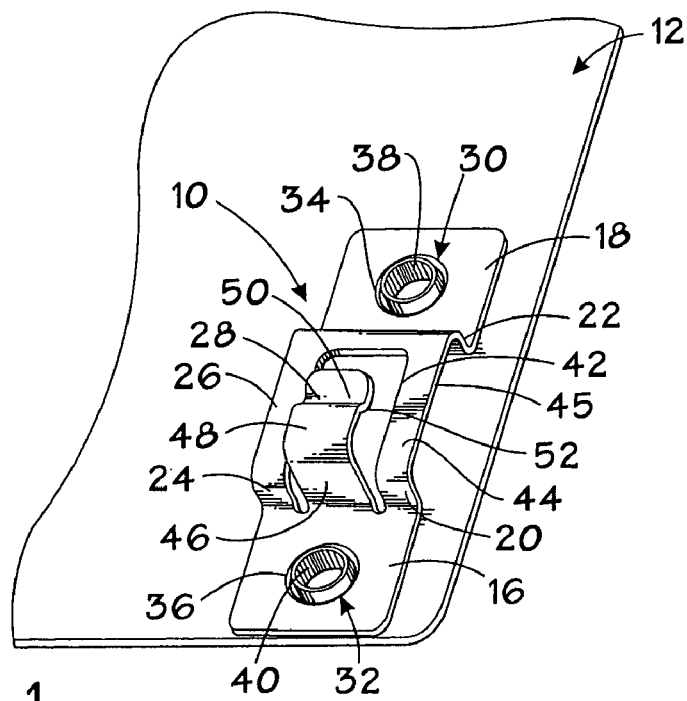
FIG. 1 is a perspective view of a fastener coupled to a support structure in accordance with an embodiment of the present technique.
FIG. 2 is a perspective view of the fastener coupling a circuit board to the support structure in accordance with an embodiment of the present technique.

FIGS. 1 and 2 illustrate an exemplary fastener 10 in accordance with an embodiment of the present technique. The illustrated fastener 10 secures a circuit board 14 to a support structure 12. As is explained in greater detail below, the exemplary fastener 10 is a toolless resilient grounding clip. That is, the illustrated fastener 10 couples to a circuit board 14 without the use of tools, accommodates boards 14 of a variety of thicknesses, and grounds both sides of the circuit board 14. However, it should be noted that present technique is not limited to fasteners 10 including a toolless resilient grounding clip, and the fastener 10 may include of a variety of fastening mechanisms, such as a clip, a resilient fastener, a grounding fastener, a toolless fastener, a resilient clip, a grounding clip, a toolless clip, a resilient grounding fastener, a toolless resilient fastener, a toolless grounding fastener, a resilient grounding clip, a toolless resilient clip, or a toolless resilient grounding fastener, for example. Alternatively, or additionally, the fastener 10 may include a hook, a clasp, a screw, a bolt, a snap-fit mechanism, an adhesive connection, a welded joint, a solder connection, a hasp, a latch, a buckle, a magnetically coupled joint, a keyhole and bullet-nose pin, a draw-pull catch, a cam actuated fastener, a lever actuated fastener, a turn operated fastener, a pawl-type fastener, a slide-action fastener, a push-pull fastener, a lift-and-turn latch, a magnetic catch, a surface mount fastener, a broaching fastener, a self-expanding fastener, a grounding standoff, a locking threaded nut, a threaded stud, a self-clenching fastener, a snap ring, a rivet, a rolled-over protruding sheet metal cylinder, and/or any other device adapted to secure the circuit board 14 to the fastener 10, for example.

The illustrated fastener 10 includes a pair of feet or mounting bases 16 and 18, three bottom risers 20, 22 and 24, a bottom member 26, and a top member 28. As is described in greater detail below, the exemplary fastener 10 of FIGS. 1 and 2 resiliently secures the circuit board 14 between the bottom member 26 and the top member 28, and the illustrated bases 16 and 18 secure the fastener 10 to the support structure 12.

In the present embodiment, the bases 16 and 18 are each generally flat plates with a generally centrally disposed base fasteners 30 and 32, respectively. As described below, the exemplary bases 16 and 18 couple to the support structure 12 through the pair of base fasteners 30 and 32. The illustrated base fasteners 30 and 32 each include a base aperture 34 or 36 and a mount 38 or 40. The illustrated mounts 38 and 40 are cylindrical deformations in the support structure 12 that extend toward the fastener 10. In the current embodiment, the mounts 38 and 40 each thread through one of the base apertures 34 and 36, and the distal end of the mounts 38 and 40 deform over the top surface of the bases 16 and 18. Deforming the mounts 38 and 40 of the present embodiment expands their distal end beyond the width of the base aperture 34 or 36, thereby horizontally and vertically securing the mounts 38 and 40 within the base apertures 36 and 34. As will be appreciated, in alternate embodiments, other devices may secure the fastener 10 to the support structure 12, such as a welded joint, a fastener or a portion of a fastener that is integrally formed from the support structure 12, an adhesive connection, a latch, a buckle, a keyhole and bullet-nose pin, a catch, an array of hooks and loops, a rivet, a screw, a bolt, a slot and tab, friction members, or any other device adapted to directly or indirectly secure the fastener 10 to the base support structure 12. Moreover, the present technique encompasses, inter alia, embodiments that include different types of base fasteners 30 and 32, more than two base fasteners 30 and 32, and a single base fastener 30 or 32, for example. The illustrated base fasteners 30 and 32 are symmetrically disposed on each of the bases 16 and 18. However, in other embodiments both base fasteners 30 and 32 may be disposed on one base 16 or 18.

The illustrated bottom risers 20, 22, and 24 space the bottom member 26 away from the bases 16 and 18. The illustrated bottom risers 20, 22, and 24 extend generally perpendicularly from the bases 16 and 18 to the bottom member 26. In alternate embodiments, the some or all of bottom risers 20, 22 and 24 may extend at a non-perpendicular angle from the bases 16 and 18. Two of the bottom risers 20 and 24 are symmetrically disposed about the top member 28. Of course, in other embodiments the pair of bottom risers 20 and 24 may be integrated into a single bottom riser, integrated with the top member 28 or individually or collectively omitted. Similarly, some embodiments in accordance with the present technique do not include a bottom riser 22, such as embodiments employing a cantilevered bottom member 26 extending from a single base 16. Moreover, some embodiments in accordance with the present technique may not employ risers 20, 22 and 24, such as embodiments where the circuit board 14 is not substantially spaced away from the support structure 12. It should also be noted that some embodiments may employ some other device to space the circuit board 14 away from the support structure 12, such as a standoff or spacer under one or both bases 16 and 18, for example.

The illustrated bottom member 26 is a generally flat member of generally uniform thickness with a bottom member aperture 42 and a lower surface or bottom contact 44. The present bottom member aperture 42 has dimensions that are slightly larger than the top member 28. As is described in greater detail below, in the present embodiment the fastener 10 is manufactured from a single piece of sheet metal, and the top member 28 is constructed from material that was previously in place of the bottom member aperture 42. In other words, a portion of the material from the bottom member aperture 42 constitutes the top member 28. It should be noted that some embodiments in accordance with the present technique may not include a bottom member aperture 42, such as a fastener 10 with a non-integrally formed top member 28. The illustrated bottom contact 44 is a grounding clipping face, i.e., an area that conducts current from objects contacting the area to ground and mechanically secures objects contacting the area. To clarify, as used herein, the term "clipping" refers to securing rather than cutting. Alternatively, or additionally, the bottom contact 44 may be a clipping face, a contact face, or a grounding contact, for instance. The illustrated bottom contact 44 is a face of the material used to manufacture the fastener 10. As used herein, the term "face" refers to the two sides of a volume that have an aspect ratio (i.e., the ratio of length to width) closest to 1, and the term "edge" refers to the other surfaces or corners of the volume. For instance, a sheet of a material often has two opposing faces that have a relatively large surface area and edges that have a relatively small surface area. In alternate embodiments, the bottom contact 44 may be an edge 45 or a curved surface. Advantageously, a bottom contact 44 on a face may reduce pressure on the circuit board 14 at the area of contact, thereby potentially reducing wear on the circuit board 14.

The illustrated bottom risers 20, 22 and 24 simply support (i.e., support at opposing ends) the bottom member 26. However, some embodiments in accordance with the present technique include a cantilevered bottom member, a bottom member 26 supported at more than two ends, and a bottom member 26 supported by a stand off that contacts an area under the bottom member 26.

The illustrated top member 28 includes a top riser 46, a top extension 48, a U-shaped bend 50, and an upper surface or top contact 52. In the present embodiment, the top riser 46 is a resilient cantilevered beam that extends generally perpendicularly from the base 16. Of course, in other embodiments, the top riser 46 may extend from the base 16 at some other angle and/or may extend from some other portion of the fastener 10, such as the base 16, the bottom member 26, or the bottom riser 20, 22 and/or 24. While the illustrated top member 28 is integrally formed with the fastener 10, in other embodiments the top member 28 may be a separate component that couples to another portion of the fastener 10. The illustrated top riser 46 extends to a greater height or outward position than the bottom risers 20, 22 and 24, thereby positioning the top extension 48 above the bottom member 26. The illustrated top extension 48 is a resilient cantilevered beam that extends generally perpendicularly from the top riser 46 over the bottom member aperture 42. The present top extension 48 also extends generally parallel to the bottom contact surface 44. However, in other embodiments the top extension 40 may not be perpendicular to the top extension 48, parallel to the bottom contact surface 44, or both. The exemplary U-shaped bend 50 resides at a distal end of the top extension 48. The illustrated U-shaped bend 50 bends about one or more axes that are generally perpendicular to the top extension 48 (e.g., in the present embodiment, one leg of the U connects to the top extension 48 and the other leg of the U is a distal end). That is, the present U-shaped bend 50 dips down and then back up as it extends away from the top extension 48. Advantageously, the present U-shaped bend 50 may facilitate insertion of a circuit board 14 between the top member 28 and the bottom member 26. The curvature of the illustrated U-shaped bend 50 may reduce the pressure at the area of initial contact (i.e., peripheral leg of U) between the top member 28 and the circuit board 14 during insertion of the circuit board 14, and then gradually increase pressure as the circuit board 14 passes along the U-shaped bend 50 toward the center of the U. As will be appreciated, other embodiments in accordance with the present technique may not employ a U-shaped bend 50 and/or may employ a component with some other shape.

The illustrated top contact 52 is a grounding clipping face on the surface of the U-shaped bend 50 that faces generally in the direction of the bottom contact 44. Additionally, or alternatively, the top contact 52 may be a grounding contact, a clipping face, and/or a contact face, for example. The illustrated top contact 52 is on a face of the material used to manufacture the U-shaped bend 50. However, in other embodiments, the top contact 52 may be on an edge 45 of the material constituting the fastener 10. As described in greater detail below, the illustrated top contact 52 and bottom contact 44 may cooperate to ground both faces of the circuit board 14 and to secure the circuit board 14.

The support structure 12 may include a variety of components that support a circuit board, such as a chassis, a sub-pan, a device bay, shielding, a housing, a project box, or a server rack, for example. The illustrated support structure 12 is a sub-pan that is manufactured from a conductive material, such as sheet metal or a conductive plastic. Advantageously, the exemplary fastener 10 grounds the circuit board 14 through the support structure 12. Of course, in other embodiments the support structure 12 may be manufactured wholly or in part from non-conductive materials, such as plastic or ceramic materials.

With reference to FIG. 2, the fastener 10 is depicted securing the circuit board 14. The illustrated circuit board 14 may include a printed circuit board (PCB), a protoboard, a bread board, and/or a strip board. The exemplary circuit board 14 is planar and of generally uniform thickness, but in other embodiments the circuit board 14 may be non-planar and/or of non-uniform thickness. A variety of electronic devices may couple to the circuit board 14, such as one or more processors, memory, heat sinks, application specific integrated circuits (ASICs), a sound card, a video card, a peripheral component interconnect (PCI) card, or any other electronic component, for instance. Routing layers within the illustrated circuit board 14 electrically connect these electronic devices. In some embodiments, the fastener 10 may secure a protective plate, electromagnetic interference shielding, a protective cover, or another support structure.

The illustrated circuit board 14 includes a top face 54, a bottom face 56 and an edge 58 with a thickness 60. Consistent with the previously discussed definition of the terms "edge" and "face", the two faces 54 and 56 of the circuit board 14 are the two sides of the circuit board 14 with an aspect ratio closest to 1.

Advantageously, in various embodiments the fastener 10 secures boards 14 of a variety of ranges of thicknesses 60, such as boards 14 with a thickness greater than, less than, or equal to one millimeter, two millimeters, three millimeters, four millimeters, five millimeters, six millimeters, seven millimeters, or more, for example. In other words, in certain embodiments, the fastener 10 complies with boards 14 ranging in thickness 60 at least partially due to the resiliency of the top rise 46, the top extension 48, and the U-shaped bend 50 of the top member 28 and the bottom member 26. For example, the top member 28 can resiliently move away from the bottom 26 to increase the intermediate gap or space to support a generally board range of circuit board thicknesses 60.

The illustrated circuit board 14 includes a mating fastener 62 with a wedge-shaped portion 63. The illustrated mating fastener 62 is a board aperture through which the top member 28 inserts. However, in other embodiments the mating fastener may be an edge 58 of the circuit board 14 or a channel in the circuit board 14. Alternatively, or additionally, the mating fastener 62 may be another fastener 10, such as those listed above, for example. The exemplary wedge-shaped portion 63 is at the end of the mating fastener 62 expected to first contact the U-shaped bend 50 when securing the circuit board 14. As is subsequently discussed in greater detail, the illustrated wedge-shaped portion 63 cooperates with the U-shaped bend 50 to facilitate insertion of the circuit board 14 between the top member 28 and the bottom member 26. However, it should be noted that other embodiments in accordance with the present technique may not employ a wedge-shaped portion 63. Moreover, in some embodiments the circuit board 14 includes other features 50 to facilitate securing the circuit board 14, such as a divot in the top face 54 to receive the top contact 52, thereby locking the circuit board 14 in the fastener 10. Alternatively, or additionally, some embodiments may employ a ridge adjacent the mating fastener 62 to lock the circuit board 14 into the fastener 10. The mating fastener 62 may also include electrical contacts on one or both faces 54 and 56 adjacent the top contact 52 and the bottom contact 44. Beneficially, the illustrated fastener 10 grounds both faces 54 and 56 of the circuit board 14 through these electrical contacts.

An exemplary procedure to secure the circuit board 14 to the support structure 12 with the fastener 10 will now be described. Initially, in the present embodiment, the circuit board 14 is lowered onto the fastener 10, as indicated by arrows 64. As the circuit board 14 is lowered, the mating fastener 62 aligns with the top member 28. In the present embodiment, the top extension 48 of the top member 28 extends through the mating fastener 62. Additionally, the wedge-shaped portion 62 aligns with the U-shaped bend 50 near the distal end of the top extension 48. Once the circuit board 14 is properly aligned, the illustrated circuit board 14 slides between the top member 28 and the bottom member 26, as indicated by arrows 66. In the present embodiment, the U-shaped bend 50 rides up the wedge-shaped portion 63 and onto the top surface 54 of the circuit board 14. As the circuit board 14 slides between the top member 28 and the bottom member 26, the portion of the top extension 48 including the U-shaped bend 50 resiliently moves upward as indicated by arrow 68. In other words, the fastener 10 non-plastically flexes to facilitate an upward motion 68 of the top extension 48 and secure the circuit board 14. Advantageously, the resilient movement represented by arrow 68 facilitates securing a variety of boards 14 with different thicknesses 60. Of course, in other embodiments the fastener 10 may plastically deform during the process of securing the circuit board 14 to the fastener 10.

When the top contact 52 reaches the top face 54 of the present embodiment, the fastener 10 secures the circuit board 14 to the support structure 12. The fastener 10 biases the circuit board 14 between the top member 28 and the bottom member 26. Advantageously, in the illustrated embodiment, the circuit board 14 couples to the fastener 10 without the use of tools, thereby potentially reducing the risk of a tool damaging the circuit board 14. However, in other embodiments tools may be used to secure the circuit board 14 to the fastener 10. In the present embodiment, once the fastener 10 secures the circuit board 14, the fastener 10 grounds both faces 54 and 56 of the circuit board 14. However, in other embodiments, the fastener 10 may ground one face 54 or 56, no face 54 and 56, a component on or off the circuit board 14, and/or an edge 58 of the circuit board 14.

The illustrated fastener 10 is stamped from a single piece of $^{25}/_{1000}$" thickness, ¾ hard stainless steel. However, as will be appreciated, other thicknesses and/or grades of metal may be employed. Moreover, substances other than metal may wholly or in part constitute the fastener 10, such as conductive and non-conductive plastics. Additionally, in other embodiments the fastener 10 may be manufactured from more than one piece of material, for example a fastener 10 with the top member 28 spot welded to riser 24.

Figure 3:
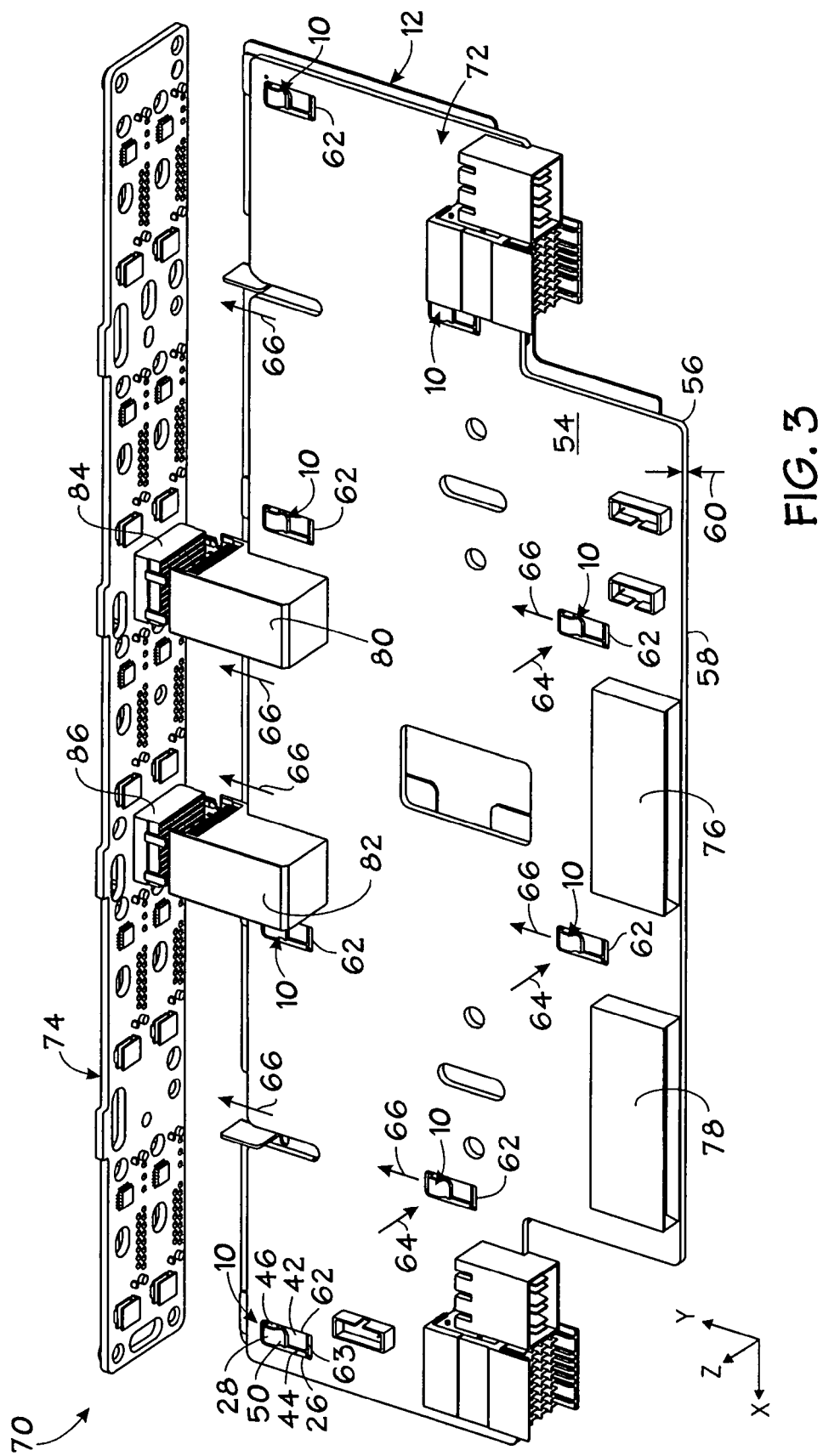
FIG. 3 is a partially-exploded perspective view of a system including the fastener and a system board in accordance with and embodiment of the present technique.

FIG. 3 is a partially-exploded perspective view of a system 70 including the fastener 10, a system board 72, the support structure 12, and a vertical back plane 74. The illustrated system 70 is a portion of a server. However, in other embodiments the system 70 may be a personal computer, a work station, a mainframe, a communication system, a home electronics device, or any other electronic device including a circuit board, for instance. The illustrated system 70 includes eight fasteners 10 and eight mating fasteners 62. The illustrated system board 72 includes power supply connectors 76 and 78 and male signal connectors 80 and 82. In the present embodiment, the male signal connectors 80 and 82 face the Y direction, and the power supply connectors 76 and 78 face in the opposite direction. The present vertical back plane 74 includes female signal connectors 84 and 86, which complement male signal connectors 80 and 82, respectively. The illustrated vertical back plane 74 is disposed perpendicular to the system board 72. However, in other embodiments, the vertical back plane 74 may lie in the same plane as the system board 72 or may be disposed at some other angle relative to the system board 72.

Figure 4:
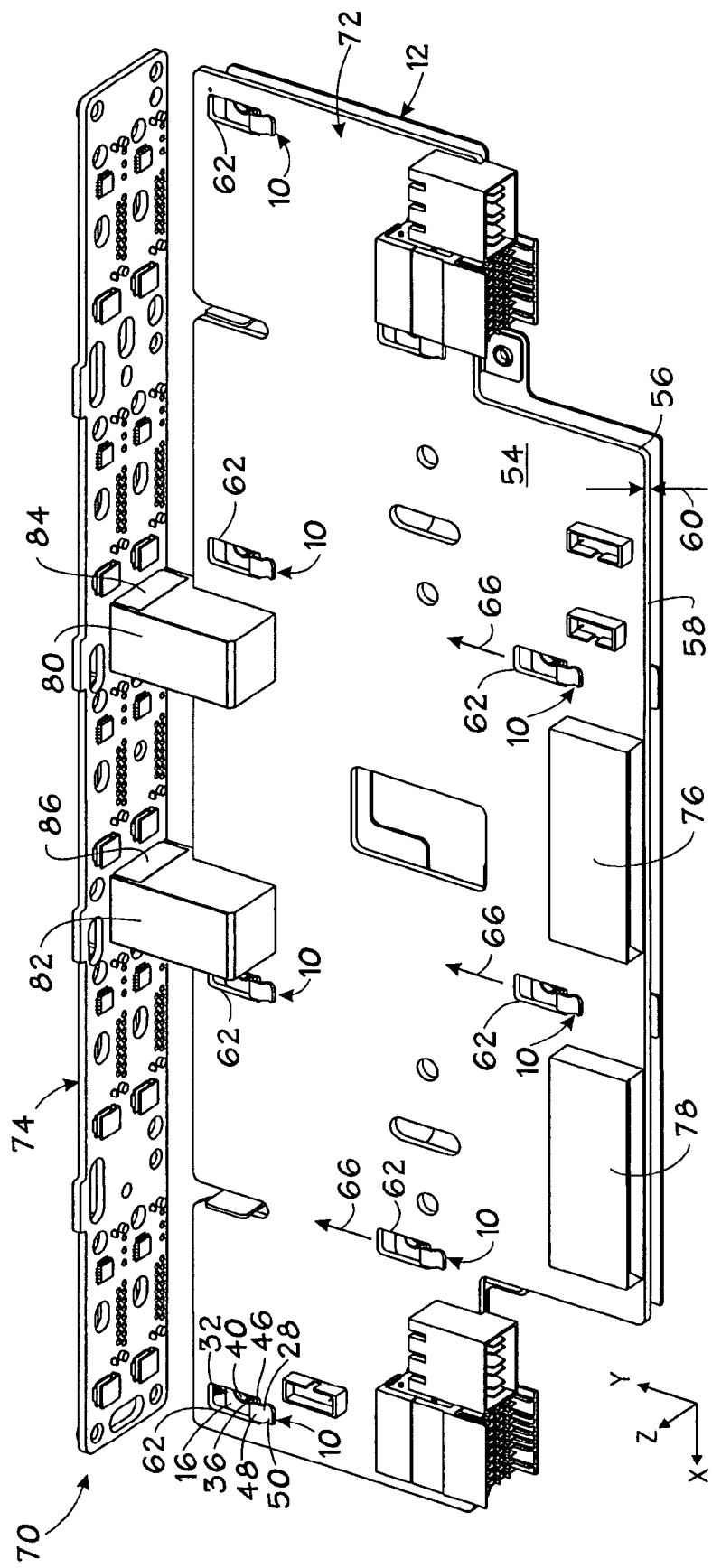
FIG. 4 is a perspective view of the system of FIG. 3, further illustrating the system board secured to a support structure via the fastener.

With reference to FIGS. 3 and 4, an exemplary procedure for connecting the system board 72 to the support structure 12 and the vertical back plane 74 will now be described. FIG. 4 illustrates a perspective view of the system 70 of FIG. 3, further illustrating the system board 72 secured to the support structure 12 via the fasteners 10. In the present embodiment, the mating fasteners 62 on the system board 72 first align with the fasteners 10. The system board 72 then lowers onto the fasteners 10, as indicated by arrows 64. At substantially the same time, the top members 28 of the fasteners 10 extend through the mating fasteners 62. Also at substantially the same time, the male signal connectors 80 and 82 align with the female signal connectors 84 and 86. Similarly, in the present embodiment, the power supply connectors 76 and 78 align with complimentary connectors of power supplies at substantially the same time. In other words, the act of aligning the fasteners 10 with the mating fasteners 62 aligns the connectors 76, 78, 80 and 82 on the system board 72 with complimentary connectors, thereby potentially simplifying the assembly process, at least in some embodiments.

Once the fasteners 10 align with the mating fasteners 62, the present system board 72 then moves in the Y direction, as indicated by arrows 66. In the current embodiment, the fasteners 10 secure the system board 72, and, at substantially the same time, the male signal connectors 80 and 82 couple to the female signal connectors 84 and 86. That is, in the present embodiment, a single movement, represented by arrows 66, both engages the system board 72 with the fasteners 10 and engages the male signal connectors 80 and 82 with the female signal connectors 84 and 86. In other words, the male signal connectors 80 and 82 couple to the female signal connectors 84 and 86 at substantially the same time as the fasteners 10 couple to the mating fasteners 62. However, in other embodiments within the scope of the present technique these connections may occur at different times.

Figure 5:
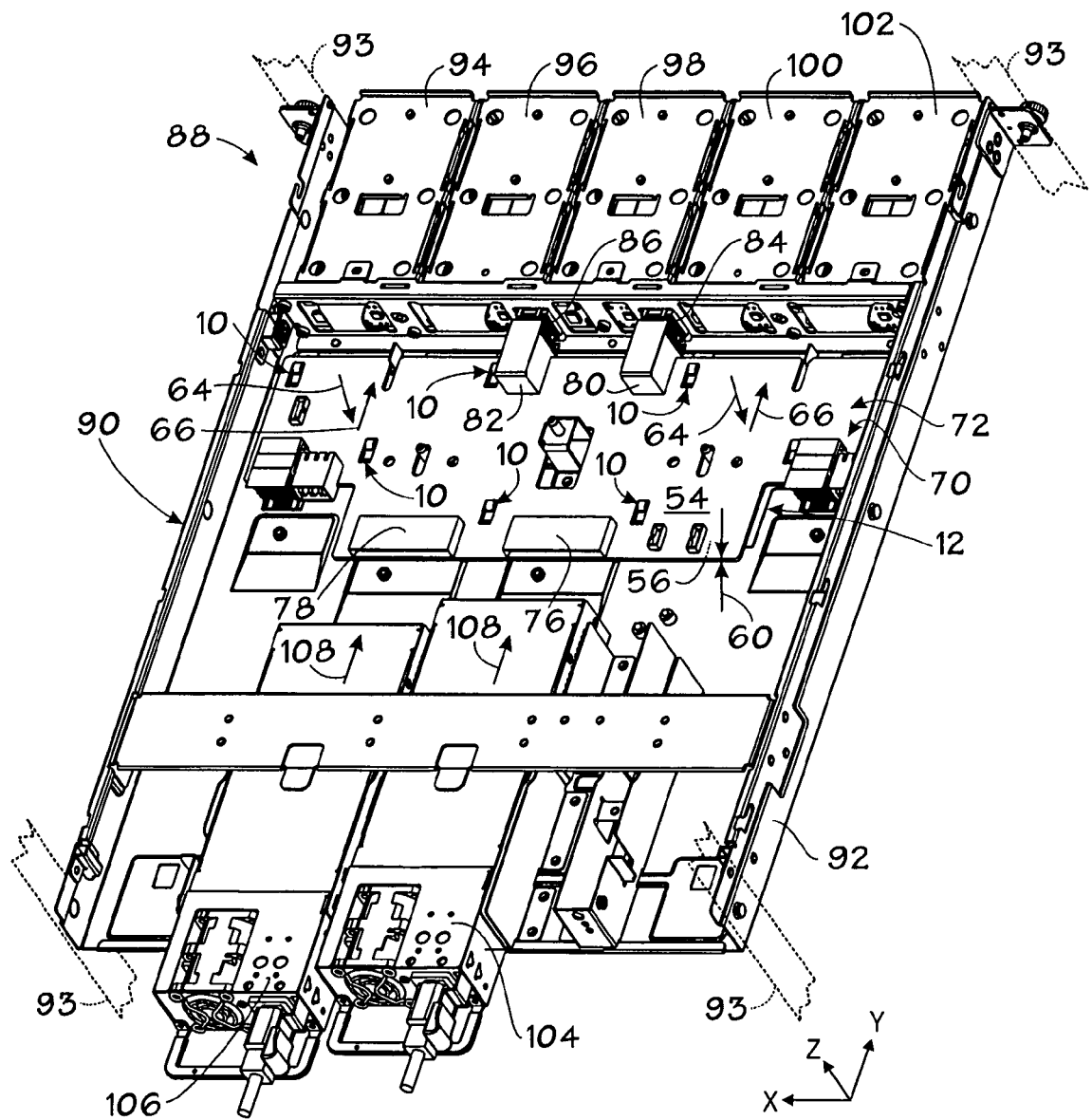
FIG. 5 is a partially-exploded perspective view of the system of FIG. 4 in a rack system in accordance with an embodiment of the present technique.

FIG. 5 illustrates a partially exploded perspective view of an exemplary rack system 88 that may include the system 70, a rack unit 90, a chassis base 92, mounting legs or rails 93, drive cages 94, 96, 98, 100 and 102, and power supplies 104 and 106. The illustrated rack system 88 includes one rack unit 90. However, other embodiments may employ a number of rack units 90, such as two, three, four, five, six, seven, eight, nine, ten, or more, for example. The illustrated rack unit 90 includes the chassis base 92 that supports the system 70. Mount rails 93 extend generally perpendicular to the chassis base 92 and support the rack unit 90 in the current embodiment. The illustrated drive cages 94, 96, 98, 100 and 102 house two hard drives per drive cage. The hard drives of the present embodiment, in the drive cages 94, 96, 98, 100 and 102, connect to the system 70 through the vertical back plane 74. The illustrated power supplies 104 and 106 connect to the system 70 through the power supply connectors 76 and 78, respectively.

Figure 6:
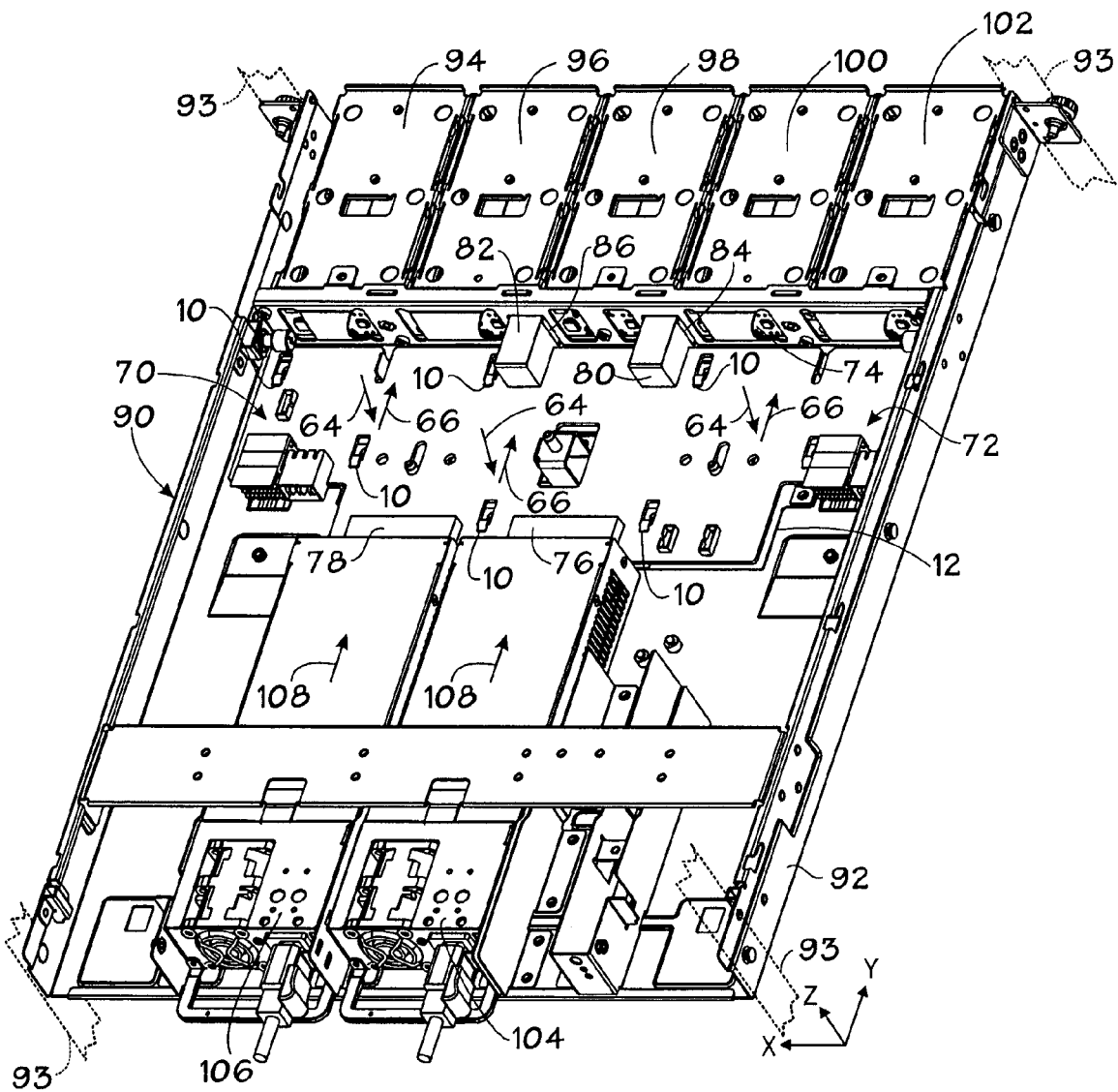
FIG. 6 is a perspective view of the rack system of FIG. 5, further illustrating the system board secured to the support structure.

With reference to FIGS. 5 and 6, an exemplary procedure for assembling the components depicted in FIG. 5 will now be described. FIG. 6 is a perspective view of the rack system 88 of FIG. 5, further illustrating the system board 72 secured to the support structure 12 via the fasteners 10 and the components secured to the board 72 on opposite ends. First, the system board 72 aligns with and lowers onto the fasteners 10, as indicated by arrows 64. At substantially the same time, in the illustrated embodiment, the male signal connectors 80 and 82 align with female signal connectors 84 and 86 on the vertical back plane 74, and the power supply connectors 76 and 78 align with power supplies 104 and 106. Next, the system board 72 moves in the Y direction, as indicated by arrows 66. At substantially the same time, in the current embodiment, the fasteners 10 secure the system board 72, and male signal connectors 80 and 82 couple to female signal connectors 84 and 86. Finally, present power supplies 104 and 106 move in the Y direction, as indicated by arrows 108. The illustrated power supplies 104 and 106 couple to power supply connectors 76 and 78, respectively. In the present embodiment, the movement to connect the power supplies 104 and 106 and the movement to connect the system board 72 (i.e., the movements represented by arrows 108 and 66) are in generally the same direction. However, in other embodiments, these movements 108 and 106 may occur in different directions, such as perpendicular or opposite one another. Advantageously, the illustrated power supplies 104 and 106 potentially block the system board 72 from decoupling from the fasteners 10 and the vertical back plane 74, thereby possibly aiding the fasteners 10 in securing the system board 72. Thus, the system components cooperate with the fasteners 10 to secure the system board 72 to the support structure 12. More specifically, the fasteners 10 secure the system board 72 in a vertical or Z direction relative to the X—Y plane of the support structure 12, while the components (e.g., power supplies 104 and 106) secure the system board 72 (and the fasteners 10) in a horizontal or reverse Y direction away from the back plane 74. Together, the back plane 74 and the power supplies 104 and 106 block opposite ends of the system board 72 without additional fasteners, such as screws or bolts.

What is claimed is

1. An electronic device, comprising:
a support structure; and
a resilient conductive clip fixedly coupled to the support structure and configured to be removably inserted through a slot in a circuit board, while fixedly coupled to the support structure, and disposed at least partially about opposite faces of the circuit board, wherein the resilient conductive clip comprises lower and upper grounding portions configured to engage against the opposite faces of the circuit board after the upper grounding portion passes through the slot, and the upper grounding portion is configured to remain stationary relative to the lower grounding portion until after the upper grounding portion passes through the slot, and wherein the resilient conductive clip further comprises:
a first base and a second base;
a first riser extending from the first base and a second riser extending from the second base;
a bottom member extending between the first riser and the second riser; and
a top member extending from the first riser and cantilevered over the bottom member, wherein,
the first base and the second base are generally coplanar;
the first riser and the second riser are generally perpendicular to the first base; and
the bottom member is generally parallel to the first base.

2. The device of claim 1, wherein the resilient conductive clip is configured to insert through the slot in a first direction generally crosswise to the circuit board, and the resilient conductive clip is configured to slide both the upper and lower grounding portions simultaneously into engagement with opposite faces of the circuit board in a second direction generally along the circuit board and crosswise with the first direction.

3. The device of claim 1, wherein the resilient conductive clip is a single piece of metal.

4. The device of claim 1, comprising the circuit board, wherein the circuit board has an edge connector coupled to an electronic component.

5. The device of claim 1, wherein the upper and lower grounding portions are substantially parallel to one another and the circuit board to define a receptacle configured to receive the circuit board lengthwise along the circuit board after the upper grounding portion passes through the slot.

6. The device of claim 1, wherein the slot is sized greater than the resilient conductive clip to enable passage of the resilient conductive clip through the slot without compression.

7. The device of claim 1, wherein the slot comprises a tapered edge.

8. The device of claim 4, wherein the edge connector is disposed on one of the opposite faces.

9. The device of claim 4, wherein the edge connector is disposed on an edge of the circuit board.

10. An electronic device, comprising:
a chassis;
a first mechanical connector disposed in the chassis;
a first electrical connector disposed in the chassis; and
a circuit board disposed in the chassis, wherein the circuit board comprises:
a second mechanical connector that mates with the first mechanical connector in a first direction generally crosswise to the circuit board, followed by a second direction generally along the circuit board and crosswise relative to the first direction; and
a second electrical connector that mates with the first electrical connector in the second direction independently, at substantially the same time, with respect to mating of the second mechanical connector with the first mechanical connector, wherein the first or second mechanical connector comprises a resilient clip, wherein the resilient clip defines a distance between the circuit board and the chassis, and wherein the resilient clip comprises:
a first base and a second base;
a first riser extending from the first base and a second riser extending from the second base;
a bottom member extending between the first riser and the second riser; and
a top member extending from the first riser and cantilevered over the bottom member, wherein the first base and the second base are generally coplanar;
the first riser and the second riser are generally perpendicular to the first base; and
the bottom member is generally parallel to the first base.

11. The device of claim 10, wherein the resilient clip comprises a grounding clip that grounds both sides of the circuit board.

12. The device of claim 10, wherein the resilient clip forms a variable gap about the circuit board.

13. The device of claim 10, wherein the resilient clip comprises an upper strip and a lower strip generally parallel to and offset from the upper strip, the resilient clip comprises a link extending crosswise between the upper and lower strips, and the link is configured to abut the circuit board upon receipt of the circuit board lengthwise between the upper and lower strips.

14. The device of claim 10, wherein the resilient clip does not compress during mating of the first and second mechanical connectors in the first direction.

15. A clip, comprising:
a first base and a second base;
a first riser extending from the first base and a second riser extending from the second base;
a bottom member extending between the first riser and the second riser; and a top member extending from the first riser and cantilevered over the bottom member, wherein:
the first base and the second base are generally coplanar;
the first riser and the second riser are generally perpendicular to the first base; and
the bottom member is generally parallel to the first base.

16. The clip of claim 15, wherein the top member comprises:
a top riser that is generally parallel to the first riser; and
a top extension that is generally perpendicular to the top riser, wherein the top extension includes a U-shaped bend.

17. The clip of claim 15, wherein the bottom member comprises a bottom member aperture with dimensions that are greater than or equal to dimensions of the top member.

18. The clip of claim 15, wherein first and second bases are independent and offset from one another in a first direction, and the first and second risers extend independently in a second direction crosswise to the first direction.

19. The clip of claim 15, wherein the clip is configured to pass through an opening without compression.

* * * * *